(12) United States Patent
Sokolov et al.

(10) Patent No.: US 8,957,406 B2
(45) Date of Patent: Feb. 17, 2015

(54) ORGANIC MATERIAL-BASED GRAPHITIC MATERIAL

(71) Applicant: The Board of Trustees of the Leland Stanford Junior University, Palo Alto, CA (US)

(72) Inventors: Anatoliy N. Sokolov, Midland, MI (US); Fung Ling Yap, Geyland East Central (SG); Zhenan Bao, Stanford, CA (US); Nan Liu, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/014,975

(22) Filed: Aug. 30, 2013

(65) Prior Publication Data

US 2014/0103297 A1 Apr. 17, 2014

Related U.S. Application Data

(60) Provisional application No. 61/714,099, filed on Oct. 15, 2012.

(51) Int. Cl.
*H01L 29/08* (2006.01)
*H01L 29/16* (2006.01)
*H01L 29/45* (2006.01)

(52) U.S. Cl.
CPC ............ *H01L 29/1606* (2013.01); *H01L 29/45* (2013.01)
USPC ........ 257/29; 257/506; 257/746; 257/E51.04; 423/448

(58) Field of Classification Search
CPC ...... H01L 29/1606; H01L 29/45; H01L 29/16
USPC ............................. 257/29, 506, 746; 423/448
See application file for complete search history.

(56) References Cited

U.S. PATENT DOCUMENTS 7,169,374 B2 * 1/2007 Siochi et al. ............... 423/447.3

OTHER PUBLICATIONS

Wang, X. & Dai, H. Etching and narrowing of graphene from the edges. Nature chemistry 2, 661-5 (2010).
Jiao, L., Zhang, L., Ding, L., Liu, J. & Dai, H. Aligned graphene nanoribbons and crossbars from unzipped carbon nanotubes. Nano Research 3, 387-394 (2010).
Kosynkin, D.V. et al. Longitudinal unzipping of carbon nanotubes to form graphene nanoribbons. Nature 458, 872-6 (2009).
Jiao, L., Zhang, L., Wang, X., Diankov, G. & Dai, H. Narrow graphene nanoribbons from carbon nanotubes. Nature 458, 877-80 (2009).
Jiao, L., Wang, X., Diankov, G., Wang, H. & Dai, H. Facile synthesis of high-quality graphene nanoribbons. Nature nanotechnology 5, 321-5 (2010).
Cong, C.X. et al. Fabrication of Graphene Nanodisk Arrays Using Nanosphere Lithography. The Journal of Physical Chemistry C 113, 6529-6532 (2009).

(Continued)

*Primary Examiner* — Elias M Ullah
(74) *Attorney, Agent, or Firm* — Crawford Maunu PLLC

(57) ABSTRACT

Various methods and apparatuses involve the provision of graphitic material. As consistent with one or more aspects herein, an organic material template is used to restrict growth, in a width dimension, of graphitic material grown from the organic material template. Graphitic material is therein provided, having a set of characteristics including electrical behavior and shape, with a representative width defined by the width dimension, based on the organic material template.

22 Claims, 8 Drawing Sheets

(56) References Cited

OTHER PUBLICATIONS

Bai, J., Zhong, X., Jiang, S., Huang, Y. & Duan, X. Graphene nanomesh. Nature nanotechnology 5, 190-4 (2010).

Liu, G. et al. Epitaxial Graphene Nanoribbon Array Fabrication Using BCP-Assisted Nanolithography. ACS nano 6, 6786-92 (2012).

Ryu, S., Maultzsch, J., Han, M.Y., Kim, P. & Brus, L.E. Raman spectroscopy of lithographically patterned graphene nanoribbons. ACS nano 5, 4123-30 (2011).

Cai, J. et al. Atomically precise bottom-up fabrication of graphene nanoribbons. Nature 466, 470-3 (2010).

Sprinkle, M. et al. Scalable templated growth of graphene nanoribbons on SiC. Nature nanotechnology 5, 727-31 (2010).

Ismach, A. et al. Direct chemical vapor deposition of graphene on dielectric surfaces. Nano letters 10, 1542-8 (2010).

Levendorf, M.P., Ruiz-Vargas, C.S., Garg, S. & Park, J. Transfer-free batch fabrication of single layer graphene transistors. Nano letters 9, 4479-83 (2009).

Yu, Q. et al. Graphene segregated on Ni surfaces and transferred to insulators. Applied Physics Letters 93, 113103 (2008).

Ye, J.Y., Umemura, K., Ishikawa, M. & Kuroda, R. Atomic force microscopy of DNA molecules stretched by spin-coating technique. Analytical biochemistry 281, 21-5 (2000).

Benke, A., Mertig, M. & Pompe, W. pH- and salt-dependent molecular combing of DNA: experiments and phenomenological model. Nanotechnology 22, 035304 (2011).

Deng, Z. & Mao, C. DNA-Templated Fabrication of 1D Parallel and 2D Crossed Metallic Nanowire Arrays. Nano Letters 3, 1545-1548 (2003).

Yang, R., Shi, Z., Zhang, L., Shi, D. & Zhang, G. Observation of Raman g-peak split for graphene nanoribbons with hydrogen-terminated zigzag edges. Nano letters 11, 4083-8 (2011).

Chung, Y., Murmann, B., Selvarasah, S., Dokmeci, M.R. & Bao, Z. Low-voltage and short-channel pentacene field-effect transistors with top-contact geometry using parylene-C shadow masks. Applied Physics Letters 96, 133306 (2010).

Guan, J. & Lee, L.J. Generating highly ordered DNA nanostrand arrays. Proceedings of the National Academy of Sciences of the United States of America 102, 18321-5 (2005).

Lui et al. "Nanosphere Lithography for the Fabrication of Ultranarrow Graphene Nanoribbons and On-Chip Bandgap Tuning of Graphene", Adv. Mater. 23, pp. 1246-1251 (2011).

Weatherup et al. "In Situ Characterization of Alloy Catalysts for Low Temerature Graphene Growth", Nano Lett. 11, pp. 4154-4160 (2011).

X.L. Li, X.R. Wang, L. Zhang, S.W. Lee, and H.J. Dai, "Chemically Derived, Ultrasmoot Graphene Nanoribbon Semiconductors", Science 319, pp. 1229-1232 (2008).

* cited by examiner

ORGANIC MATERIAL-BASED GRAPHITIC MATERIAL

RELATED PATENT DOCUMENTS

This patent document claims benefit under 35 U.S.C. §119 to U.S. Provisional Patent Application Ser. No. 61/714,099, entitled "POLYMER-BASED GRAPHITIC MATERIAL" and filed on Oct. 15, 2012, which, along with appendices and any cited references therein, is fully incorporated herein by reference.

FEDERALLY-SPONSORED RESEARCH AND DEVELOPMENT

This invention was made with Government support under contract 1006989 awarded by the National Science Foundation. The Government has certain rights in this invention.

BACKGROUND

Despite certain desirable electrical characteristics of single- and multi-layer graphene, the development of circuits such as field-effect transistors (FETs) based on this semi-metal has often been impractical. For instance, such materials often do not exhibit a bandgap as is desirable in the operation of various circuits.

One type of graphene material that has been developed is graphitic nanomaterial, sometimes in the form of graphitic nanoribbon material, having small widths. Such nanoribbons may be made via the lateral unzipping of carbon nanotubes, or plasma etching of graphene through nanoscale masks that may, for example, be prepared using nanospheres, block copolymers or lithography. In these methods, a chemical reaction occurs at an edge and results in the formation of the graphene nanoribbon structure. However, for such materials less than 10 nm in width, disorder at the edges can significantly impact electronic properties.

Direct synthesis of such graphitic materials has also been achieved. One such approach involves using bottom-up synthesis from molecular components, in which a surface-catalyzed chemical reaction is used to form nanoscale ribbons of desired shapes based on the molecular precursors. Another approach is based on epitaxial graphene growth on silicon carbide utilizing the preferential precipitation of graphene on pre-patterned facets. This latter method relies on lithography to define the molecular terraces that serve as a support for graphitic nanoribbon growth, meaning the width of the resulting graphene nanoribbon structures is limited by lithography (e.g., in the range of 15 to 40 nm).

These and other matters have presented challenges to semiconductor apparatuses and related methods, for a variety of applications.

SUMMARY

Various example embodiments are directed to organic-based graphitic material such as narrow graphitic nanostructures (GNS), graphitic nanoribbons (GNR), as well as related circuits, apparatuses, methods and their implementation.

According to an example embodiment, graphitic material is grown from an organic material, using the shape of the organic material to control resulting shape and electrical characteristics of the graphitic material. In some implementations, metal ions are used to catalyze the growth (e.g., with the metal ions being infused or otherwise coupled with the organic material). In various implementations, the graphitic material is grown having a bandgap imparted or set by the shape of the organic material.

Another example embodiment is directed to method as follows. An organic material template is provided, and which is configured and arranged to restrict growth in a width dimension. Graphitic material is grown from the organic material template while restricting growth in the width dimension. Grown graphitic material is provided therefrom, in which the graphitic material has a set of characteristics, including electrical behavior and shape with a representative width defined by the width dimension, which is based on the configuration and arrangement of the organic material template.

Another example embodiment is directed to an apparatus including an organic material template configured and arranged to restrict graphitic material growth in a width dimension, and graphitic material having a set of characteristics, including electrical behavior and shape with a representative width defined by the width dimension, which is based on the configuration and arrangement of the organic material template.

Another example embodiment is directed to an apparatus including a substrate, electrode regions including graphene on the substrate, and an organic material template extending between the electrode regions and configured and arranged to restrict the grown of the graphitic structure (or GNS) in a width dimension and in a direction extending between the electrode regions. The apparatus further includes a semiconductor channel including semiconducting graphitic structure extending between the electrode regions and having a set of characteristics, the graphitic structure including electrical behavior and shape with a representative width defined by the width dimension, which is based on the configuration and arrangement of the organic material template. Metal ion material is configured and arranged with the substrate and the organic material to catalyze direct growth of the graphitic structure from the organic material while concurrently growing the graphene.

Another example embodiment is directed to an apparatus including an organic material that couples to (e.g., absorbs/binds to) metal ions. The metal ions are operable to catalyze the growth of graphitic material/structures such as nanoribbons, while the organic material is shaped in a manner that sets a bandgap of the graphitic material. In some implementations, the apparatus includes metal material resulting from in-situ reduction of the metal ions. In a more particular embodiment, the apparatus includes a substrate upon which the polymer is formed, graphene on the substrate and semiconducting structures connected to the graphene.

For information regarding details of other embodiments, experiments and applications that can be combined in varying degrees with the teachings herein, reference may be made to the teachings and underlying references provided in the U.S. Provisional Patent Application Ser. No. 61/714,099, including Appendices A-E which form part thereof, to which benefit is claimed above, and all of which is fully incorporated herein.

The above overview is not intended to describe each embodiment or every implementation of the present disclosure. The figures and detailed description that follow also exemplify various embodiments.

DESCRIPTION OF THE FIGURES

Various example embodiments may be more completely understood in consideration of the following detailed description in connection with the accompanying drawings in which.

Figure 1:
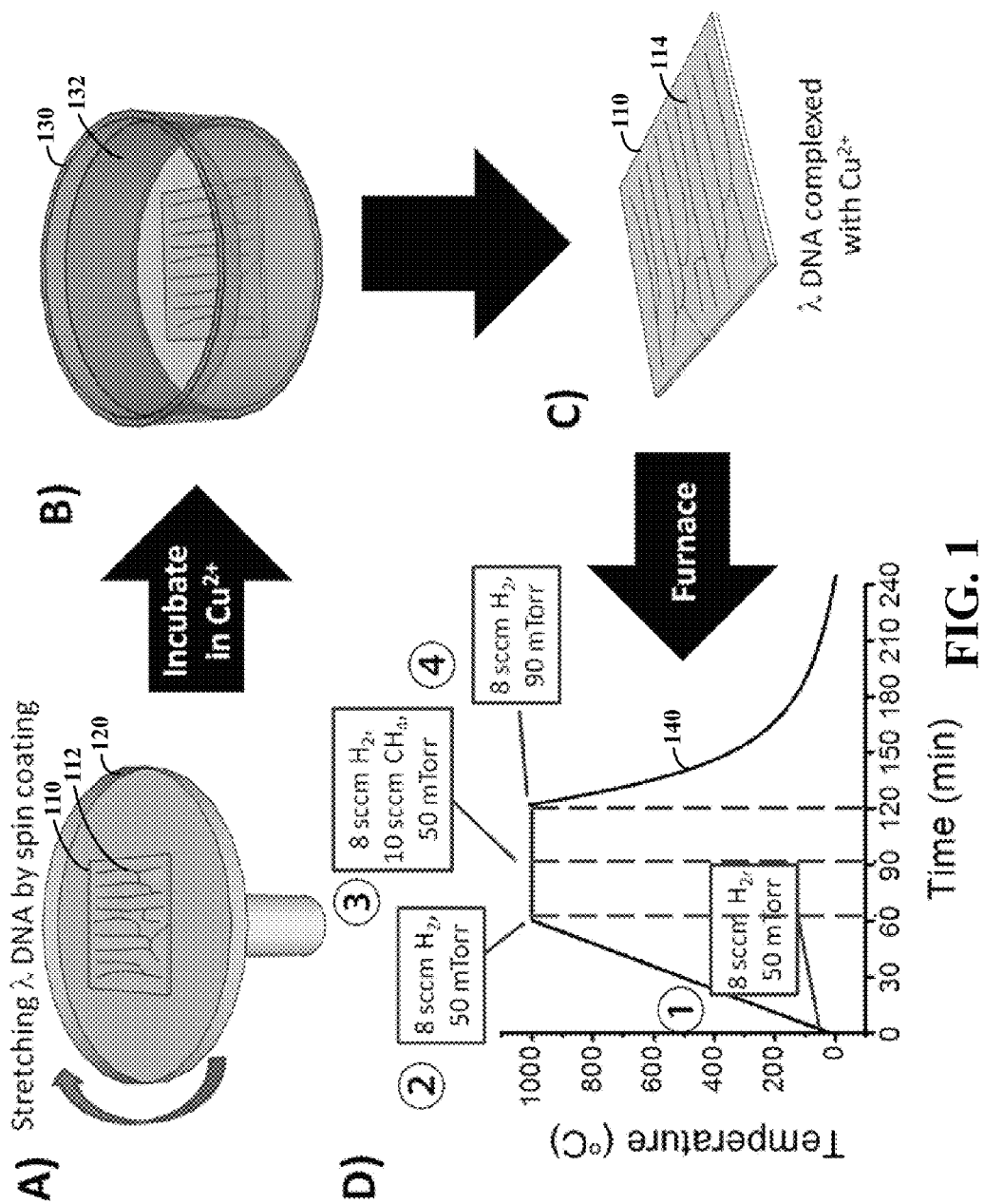
FIG. 1 shows an apparatus and approach for forming graphitic material using an organic material template, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents and alternatives falling within the scope of the disclosure including aspects defined in the claims.

DETAILED DESCRIPTION

Aspects of the present disclosure are believed to be applicable to a variety of different types of apparatuses, systems and methods involving the formation of graphitic material. While not necessarily so limited, various aspects may be appreciated through a discussion of examples using this context.

In accordance with one or more embodiments, an organic material template is provided, which restricts growth of graphitic material in a width dimension. Such graphitic material is grown from the organic material template, while restricting the growth in the width dimension. From this growth, grown graphitic material is provided with a set of characteristics, including electrical behavior and shape with a representative width defined by the width dimension, which is based on the configuration and arrangement of the organic material template.

In some implementations, a bandgap is set or imparted to the grown graphitic material. This approach can be coupled with the use of metal ions to catalyze the graphitic material growth. Such a bandgap may be implemented, for example, by controlling the width of the graphitic nanomaterial with the organic material template, therein imparting a bandgap to the graphitic material that renders the graphitic material semiconducting.

In accordance with other embodiments, metal ions are coupled to an organic material, such as by binding metal ions to an organic polymer. The metal ions are implemented as a catalyst to grow graphitic material, with the shape of the organic material and the related location of the metal ions being implemented to set bandgap characteristics of the graphitic material.

In more particular embodiments, the organic material template is provided on a substrate and used to restrict growth of the graphitic material in the width dimension. For example, semiconducting graphitic nanostructures (or nanoribbons) are concurrently grown from the organic material while conducting graphene is grown on the substrate. Such an approach can be implemented for forming conductive electrodes on the substrate and on semiconducting nanoribbons connecting the electrodes.

In certain embodiments involving the use of metal ions, growing graphitic material from the organic material template includes using metal ions to catalyze the growth while maintaining binding of the metal ions with organic material under growth conditions favorable as relative to metal-based catalysts (e.g., with few or no ions). Such growth conditions may involve those in which Ostwald ripening facilitates diffusion of the metal ions, or in which metal corresponding to the ions would melt or evaporate (or do so sooner than the metal ions evaporate, facilitating graphitic material growth prior to such metal ion evaporation). Such Otswald ripening may include, for example, dissolution and redeposition of small crystals or particles.

In various embodiments, graphitic material is doped using one or more of a variety of approaches. In some embodiments, the organic material template is doped, and the dopant in the organic material is used to dope the graphitic material. In other embodiments, the graphitic material is doped by introducing a carrier gas including a dopant to the organic material while growing the graphitic material.

Growing the graphitic material may involve one or more of a variety of approaches. In some embodiments, the graphitic material growth is catalyzed by reducing metal ions in-situ. In other embodiments, $sp^2$ carbon growth is catalyzed using metal ions. In still other embodiments, a bandgap is imparted or set in the graphitic material as a function of a density of metal ions on the organic material. In still other embodiments, metal ions are used to screen a negatively-charged component of the organic material, such as to screen negatively-charged aspects of DNA.

In some embodiments, an approach as described above is implemented to form bottom-up semiconducting graphitic structures, without necessarily involving further processing to render the graphitic structures semiconducting (e.g., the graphitic structures are semiconducting as-grown). Further, such approaches can be used to grow graphitic structures (e.g., 20 nm or less in width) operable as a semiconducting region for a multitude of applications, such as those involving transistors, photovoltaic devices, touch screens, solar cells and radio frequency circuits. More particular example embodiments are directed to the concurrent growth of such semiconducting graphitic structures and conducting graphene in a semiconductor circuit. Various example method-based embodiments are directed to the direct, aligned growth of graphitic (e.g., carbon-carbon) nanoribbons based on a solution-processed polymer template such as a DNA template.

As consistent with various embodiments, graphitic structures and the term "graphitic" refers to carbon-based materials (as in material that includes carbon). Such carbon-based materials may include one or more of a carbon-carbon single-bonded material, carbon-carbon double-bonded material, graphene, amorphous carbon, carbon and nitrogen, and carbon and a metallic ion such as carbon and a salt.

In connection with these embodiments, it has been discovered that the use of metal ions, coupled with such an organic material template, can catalyze the direct (bottom-up) growth of graphitic nanomaterials, such as by growing GNSs along polymers. It has further been discovered that such an approach can be implemented at growth conditions (e.g., high temperature) under which metal-based catalysts may melt and/or evaporate, by using the ionic state of such metal and this state's corresponding stability at high temperature to facilitate the catalytic action. Further in connection with these discoveries, a new and/or expanded group of metals can be used as catalysts in such reactions in the formation of GNSs, where such metals in a non-ionic state would otherwise melt/evaporate under graphene-type growth conditions.

In various embodiments using approaches and apparatuses as discussed herein, GNSs or GNRs are less than 10 nm in width and can exceed 20 μm in length. The growth of GNSs can be implemented under graphene growth conditions, which may be implemented to concurrently grow graphene for combined graphene-GNR structures. Accordingly, the same growth conditions that are used to grow pristine single- or multi-layer graphene flakes can also be used to grow GNSs, utilizing surface functionalization. The length of the resulting ribbons ensures that simple photo-lithographic techniques can be used to define the areas for single-layer graphene flakes to act as interconnects or contacts. This discovery facilitates single-step direct circuit growth based on all-graphene components. In similar approaches, graphitic material such as GNSs is controlled in width to less than 20 nm, less than 50 nm, or less than 100 nm.

Accordingly, various embodiments are directed to the bottom-up synthesis of GNSs using an organic template, such as a DNA template. Owing to the use of a molecular template, the resolution that can be achieved is much smaller than top-down lithographic techniques. Various embodiments are directed to the alignment of DNA (or other polymer) by spin coating, electro-spinning, nanoimprinting, block copolymer templating, shearing or dip coating. In some embodiments, the DNA is placed into ordered arrays over large areas and used to facilitate the production of GNS-type FETs over a large scale. The ability to precisely align the DNA on the surface prior to GNS growth may be used to mitigate the need to post-assemble the GNSs, which can be a challenge in the nano-electronics industry owing to the lack of functional groups on all-carbon materials. In various such embodiments, wafer scale fabrication and/or electro-spinning are implemented for roll-to-roll fabrication.

In certain embodiments, DNA is used to provide a robust platform for exchange of metal catalysts or base-pair structures to create desired shapes and functionalities. Other organic templates (e.g. polymers) are used for a variety of embodiments, such as to provide for the incorporation of additional metals or organic functionalities that lead to in-situ doping of the GNSs (e.g., forming p-n junctions). In certain embodiments, as-grown GNSs include a mixture of graphene and amorphous carbon domains. Many applications are directed to the single-step formation of both conducting and semiconducting components, and direct growth of all-graphene integrated circuits.

In various embodiments, metal salt catalysts are implemented as metal ions as discussed herein, to catalyze the growth of semiconducting graphitic material. Such approaches may, for example, be implemented to address issues with fabricating ultrathin metal lines of sub-20 nm and sub-10 nm widths, under chemical vapor deposition (CVD) growth conditions such as those relating to the de-wetting of nanoscopic metal films at relatively low temperatures. A nanoscopic organic template is impregnated with a metal salt (e.g., $Cu^{2+}$) and used to form features, while mitigating/preventing metal diffusion or de-wetting. In this fashion, the separation between ions within the template and the ionic nature of metal assists in maintaining the integrity of line features until graphene or other graphitic material growth occurs. In some embodiments, DNA is used to achieve line structures with widths less than 10 nm through a template-based approach. DNA can be stretched easily by molecular combing and can be implemented to form nanowires via the binding and subsequent reduction of metal salts. Moreover, the unique ability of the DNA to complex varying metal salts provides a large window for the mechanistic control of graphene growth. In some implementations, aligned DNAs are transferred onto a prepared DNA array and rotated by about 90° to form a cross pattern. These DNAs are metalized with ions and converted to graphene nanoribbons, using a CVD process as discussed herein.

While various embodiments refer to the use of $Cu^{2+}$ salts, additional metals such as Ni and Co can be used for catalytic graphene growth. The use of other metals is also facilitated in accordance with various discoveries herein, such as with respect to the ability of metal ions to withstand CVD growth conditions that the respective metals from which the ions are formed cannot. Various CVD conditions are used to form GNSs, leveraging graphene-based approaches. Moreover, various embodiments involve concurrent growth of two-dimensional graphene sheets via copper or nickel evaporated thin films, such as described in Levendorf, M. P., Ruiz-Vargas, C. S., Garg, S. & Park, J., "Transfer-free batch fabrication of single layer graphene transistors," *Nano letters* 9, 4479-83 (2009); and in Yu, Q., et al. "Graphene segregated on Ni surfaces and transferred to insulators," *Applied Physics Letters* 93, 113103 (2008), both of which are fully incorporated herein by reference.

Organic material as described herein includes one or more of a variety of materials, as may be implemented to suit various embodiments. For instance, templates that can be prepared to facilitate sub-10 nm width of resulting graphitic material, while being assembled in a controlled and scalable fashion, can be implemented with various embodiments. The following example organic materials are thus implemented in accordance with one or more embodiments: a polymer film infused with metallic ions, a peptide-based polymer, a self-assembled molecule configured and arranged to couple with metallic ions, DNA, a block copolymer in which one of the blocks selectively couples with metal ions, a polymer blend that forms phase-separated nanostructures and microstructures in which one of the polymers couples with metal ions, a nanoimprinted polymer nanostructure, a polymer having a treated surface that couples with metal ions, an electrospun polymer nanostructure, a self-assembled polymer nanostructure, a biopolymer nanostructure that couples with metal ions, and a polymer selected from the group of: N-containing polymers, —COOH or COO— containing polymers, S-containing polymers, and polymers with anions.

Other polymers used with various embodiments include those prepared by block copolymer nanopatterning: poly(vinyl pyridine) (PVP), organosilicate, poly(styrene)-co-poly(methyl metharylate) (PS-PMMA), poly(styrene)-co-poly(butadiene) (PS-PBD), and polystyrene. In some instances, organosilicate and polystyrene are surface treated to facilitate cation binding. For electro-spinning, polymers used with certain embodiments include metal binding poly(acrylic acid), poly(vinyl phenol), DNA and PVP. Metal salts or nanoparticles can be mixed directly into the polymer or absorbed after a film or nanofibers are deposited.

In many embodiments, one or more non-ion-binding polymer nanostructures can be used to facilitate graphitic nanomaterial growth as discussed herein, and achieved without necessarily using ions. Such an approach may be facilitated, for example, using a carbon-supply gas such as $CH_4$ or other gas that facilitates growth of graphitic (nano) material without necessarily employing metal ions.

In certain implementations, non-metal-binding polymers are used with ozone or oxygen plasma to generate —OH and —COOH functional groups for metal binding. In some instances, these sites are further modified with pyridine silanes for metal ion binding.

In some embodiments, a poly(styrene)-co-poly(vinylpyridine) (PS-PVP) template BCP is used for graphitic material growth. A metal salt in water is mixed with the BCP in a non-polar solvent, such as toluene. The PVP part of the BCP is more polar than the PS block. The salt/water is therefore encapsulated inside the micelle formed by the PS-PVP. This micelle solution can be subsequently spin coated or dip coated to form ordered nanostructures. The molecular weight ratio between the two blocks determines whether lines or dots will be formed while the size of the nanostructure depends on the molecular weight and the salt loading.

Various embodiments are directed to apparatuses employing graphitic material as described herein. In one or more embodiments, such an apparatus includes graphitic material and an organic material template, such as DNA, that restricts growth of the graphitic material in a width dimension. The graphitic material has characteristics, including electrical behavior and shape including a representative width defined by the width dimension, that are based on the organic material template. In certain implementations, the apparatus includes the graphitic material as-formed from the organic material template, with a portion of the template being used (and removed) during the formation of the graphitic material, with an unused/remaining portion or remnants of the template remaining. In respective implementations, whether the as-grown material evidences such template remnants in volume, negligibly or not at all, the formation, observable and/or other noted characteristics of the graphitic material manifest themselves as being grown from the template (e.g., by way of the remnants and/or lacking of etching to obtain such widths). In some instances, the as-grown graphitic materials distinguish themselves from other processes, for example, where the graphitic material is not grown from the template and/or etched to obtain the narrow widths, or wherein metal ions (as may be used to catalyze the growth) manifest in the graphitic as-grown structures.

In a more particular embodiment, the apparatus includes metal ions that are coupled to (e.g., infused in) the organic material, and which catalyze growth of the graphitic material. In other embodiments, the organic material template sets or imparts a bandgap of the graphitic material by restricting growth of the graphitic material in the width dimension.

A variety of materials may be used as the organic material, to suit particular applications. In some embodiments, the organic material template is a DNA template that controls a direction of the graphitic material growth and restricts the graphitic material growth in the width dimension to impart or set a bandgap in the graphitic material. In another embodiment, the graphitic material includes narrow semiconducting structures in which the (representative) width dimension is not greater than 10 nm.

Using such above-discussed processes (and also those below), such as-grown graphitic ribbons are used as interconnects and electrical devices are connected using, as interconnects, thicker graphitic structures (e.g., GNSs or GNRs). In certain implementations, for example, the GNR is one layer (or in one layer) and narrower than 10 nm, thereby behaving electrically like a semiconductor, whereas another GNR is grown from the template to be thicker and/or wider than 10 nm, thereby behaving electrically like a metal conductor. Depending on the circuit application, such GNSs/GNRs are used as conductors (or wires) in addition to (or instead of) semiconductors.

Turning now to the Figures, FIG. 1 shows steps involved in GNS synthesis using an organic material template, in accordance with one or more embodiments. The approach in FIG. 1 is described using a phenyltrimethoxysilane modified silicon dioxide substrate, a lambda-DNA template, and a copper salt by way of example. However, the approach may be implemented similarly using different types of organic material, different substrates and different metal salts.

At step A, a phenyltrimethoxysilane modified silicon dioxide substrate 110 having λDNA 112 formed thereupon is placed in a spin-coating apparatus 120. At step B, the substrate 110 is incubated in a solution container 130 having a copper(II) salt solution 132, to form λDNA complexed with $Cu^{2+}$ ions 114 as removed from the solution at step C. At step D, the λDNA complexed with $Cu^{2+}$ ions is subjected to a CVD growth process as represented by plot 140, showing time versus temperature with the introduction of gasses as shown. These approaches facilitate the formation of the graphitic structures from a metalized DNA template.

In certain embodiments, a solution of lambda double-stranded DNA (dsDNA) is spin coated onto a phenyltrimethoxysilane modified silicon wafer, to obtain aligned DNA lines stretching over 20 μm in length. In other embodiments, a desired polymer shape is achieved using molecular combing and/or self-assembly/DNA origami. Following spin coating (or other procedure as above), the DNA films are immersed into a solution of the desired metal ion. As an example, a 0.1 M solution of $Cu(NO_3)_2$ can be used to infuse the DNA with copper as the catalyst. The wafers are subsequently placed into a single zone furnace and subjected to graphene CVD growth conditions.

In accordance with various embodiments, growth conditions utilized for conductive single-layer graphene growth are used to facilitate the integration of directly grown GNSs within predefined conductive elements, leading to single step growth of all-carbon circuits. A furnace is raised to 1000° C. under a hydrogen flow of 8 sccm at 90 mTorr, and kept for 30 min. at 50 mTorr to reduce copper ions intercalated in the DNA. In the growth step, methane and hydrogen are introduced at 8 and 10 sccm, respectively, at a pressure of 50 mTorr for 30 min. The furnace is then cooled to room temperature, maintaining hydrogen flow at 8 sccm at 90 mTorr. By way of example, this process is denoted in various embodiments as standard growth process or SGP, and may be implemented in accordance with the approach shown in FIG. 1 as plot 140. Following the growth, GNSs can be analyzed using Atomic force microscopy (AFM), SEM, TEM, Raman Spectroscopy, X-ray Photoemission spectroscopy (XPS) and integrated within devices for electrical characterization.

Figure 2:
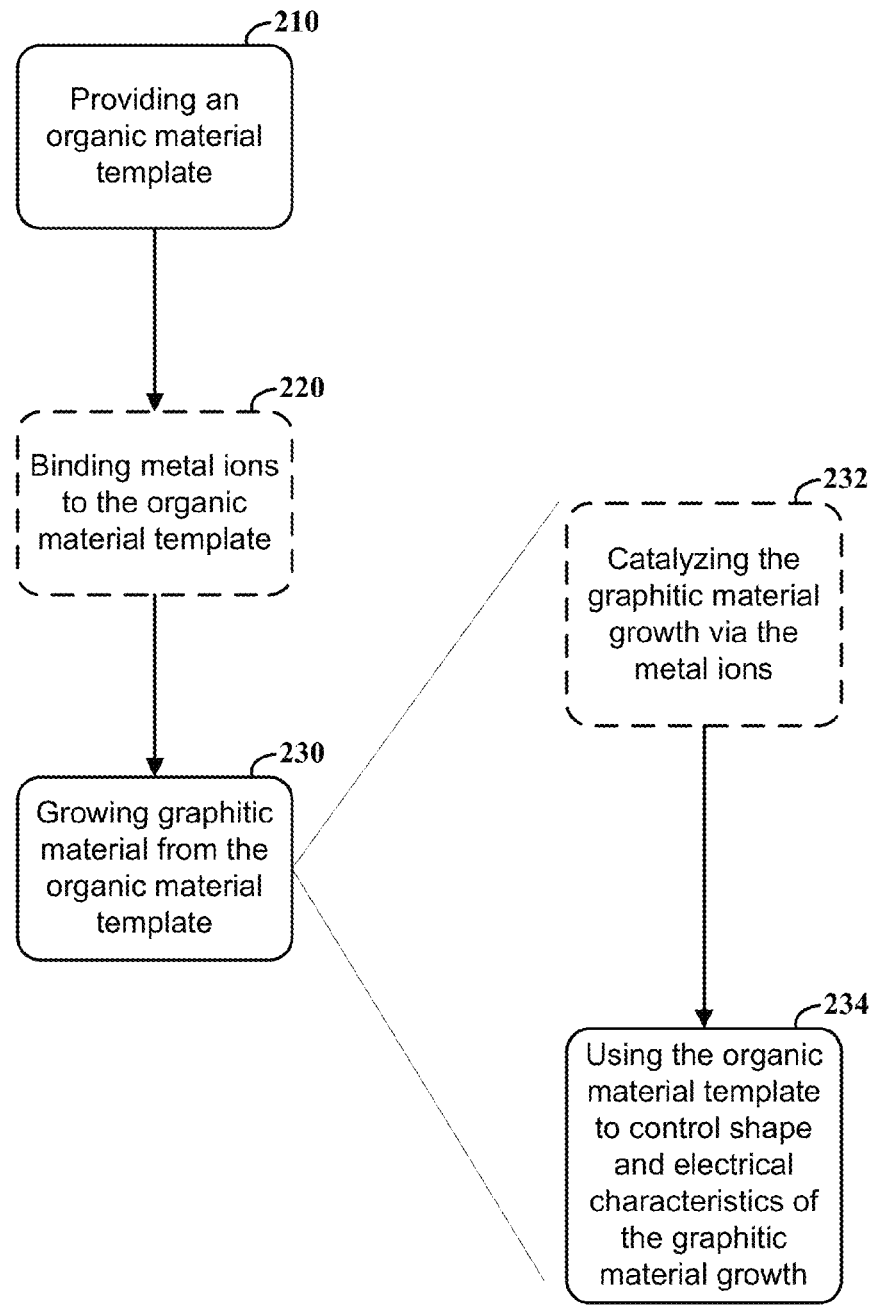
FIG. 2 shows a flow diagram for a method of forming graphitic material, in accordance with another example embodiment.

FIG. 2 shows a method 200 in which graphitic nanomaterial is grown, in accordance with another example embodiment. An organic material template is provided at block 210. This organic material template may include, for example, a polymer type material or DNA-type material as described herein, shaped to appropriately control ensuing growth of graphitic material. Further, the organic material may be provided on a substrate, and otherwise arranged to form one or more of a variety of types of circuit components.

At block 220, metal ions are optionally coupled (e.g., via chemical bonds) to the organic material template. This approach may involve, for example, introducing a metal salt to the organic material in a solution or other form, and binding ions of the metal salt to the organic material. At block 230, graphitic material is grown from the organic material template. Where metal ions are used, this growth involves using the metal ions to catalyze formation of the graphitic material at 232, such as by interacting the metal ions with a carbon-containing gas as described herein. The growth is controlled at 234 using the organic material template, to control shape and electrical characteristics (e.g., a bandgap) of the graphitic material. Imparting or setting the bandgap in this regard may, for example, involve forming the organic material in a particular shape (e.g., on a substrate) and using the shape to control a dimension of the graphitic material as it is grown, and imparting the bandgap to the graphitic material via the shape (e.g., maintaining width dimensions as discussed herein).

In some implementations, a density and amount of bundling of the organic material are controlled via the organic material itself and ionic concentration. One such approach with DNA organic material involves adding sodium chloride to increase the bundling of DNA via the screening of a negatively charged DNA backbone. These parameters are used to control the width and height of the resulting graphitic material. For instance, such a DNA template can be used to grow semiconducting GNSs or GNRs having a width dimension not greater than 10 nm, using metal ions to catalyze the growth and imparting a bandgap to the nanoribbons.

Figures 3A, 3B:
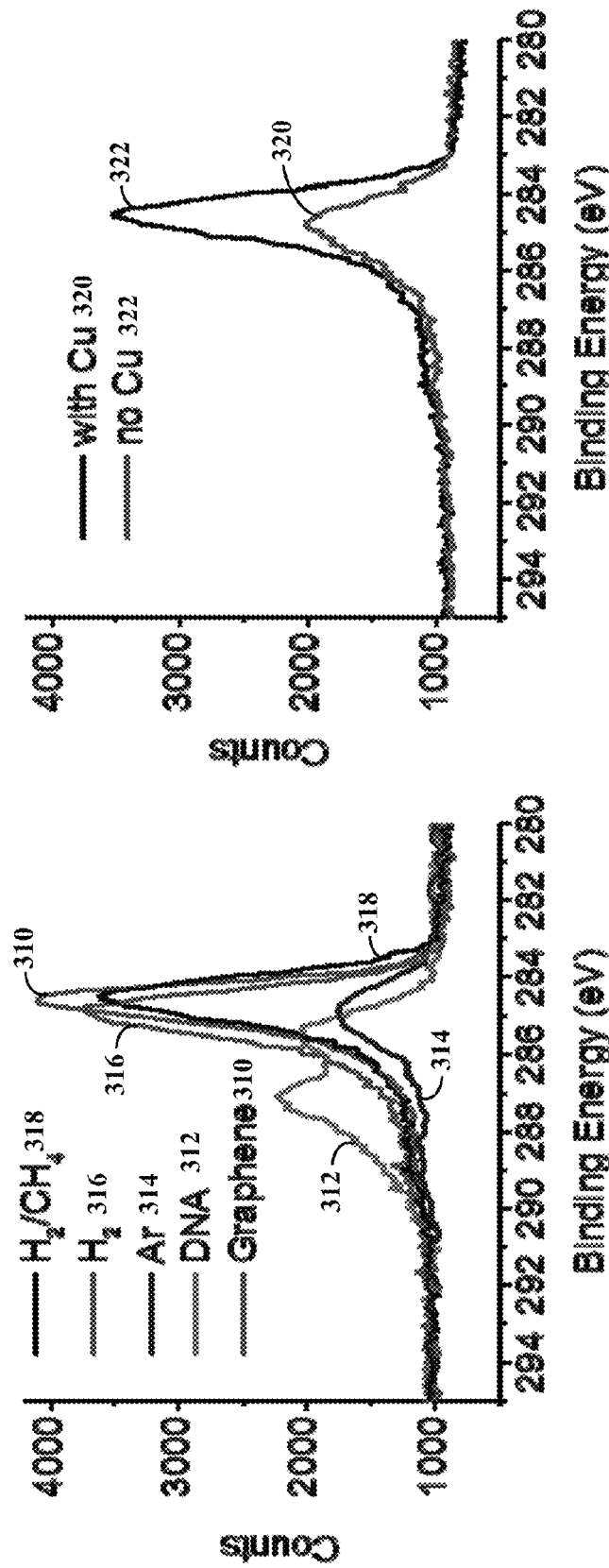
FIG. 3A shows plots of binding energy for CVD-grown graphene with treated DNA templates on a $SiO_2$ substrate, in accordance with one or more embodiments.
FIG. 3B shows plots of DNAs with and without $Cu^{2+}$, in accordance with one or more embodiments.

FIG. 3A shows binding energy for CVD-grown graphene with treated DNA templates on a $SiO_2$ substrate, in accordance with one or more embodiments. Graphene 310 (highest peak) has a main peak at 284.5 eV with asymmetric tailing towards higher binding energy. Plots 312, 314, 316 and 318 are shown for DNA, Argon, $H_2$ and $H_2/CH_4$, respectively. Upon exposure to the standard CVD process discussed above, the C1s peak of the DNA template is diminished to a dominant C—C peak at 284.4 eV, indicating a significant conversion to a $sp^2$ carbon structure. In certain embodiments, methane is used as a hydrogen scavenger to convert $sp^3$ carbons into $sp^2$ carbons. In some embodiments involving the use of a copper salt $Cu^{2+}$ with DNA, the salt is converted to $Cu^0$ by $H_2$ in order to act as a catalyst for $sp^2$ carbon formation.

FIG. 3B shows an effect of infusing DNAs with $Cu^{2+}$ to achieve a binding energy of 284.8 eV, with the low peak at plot 320 being indicative of $sp^3$ hybridized carbon bonds from amorphous aliphatic carbon, and the high peak at plot 322 being indicative of $sp^2$ carbon ($Cu^{2+}$ being reduced). The resulting $Cu^0$ is used as a catalyst to convert $sp^3$ hybridized carbons to $sp^2$ carbons in the presence of $CH_4$. In some implementations, all non-carbon compounds present in the DNA template were removed during the CVD process.

Figure 4:
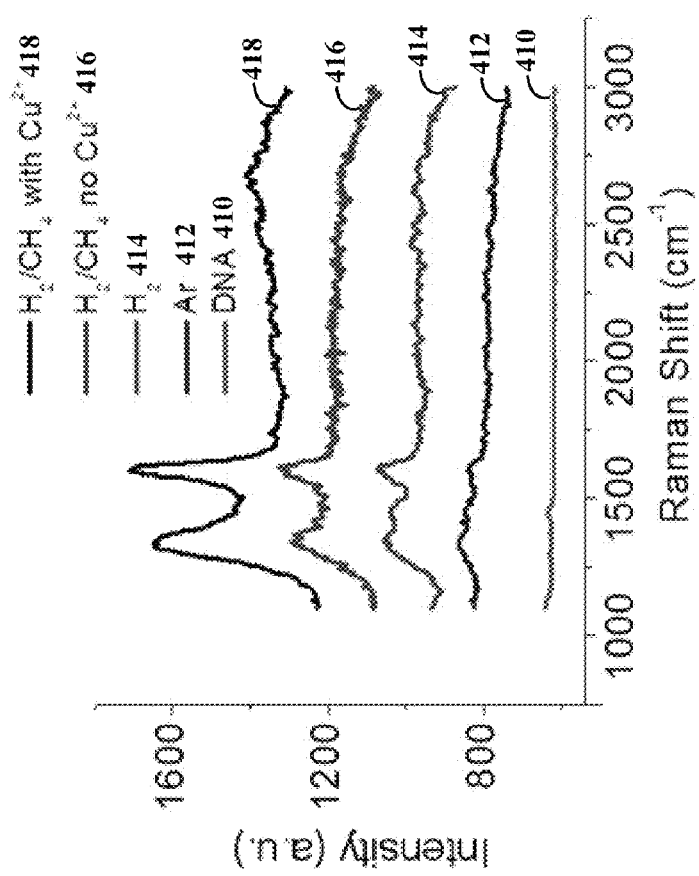
FIG. 4 shows Raman shift versus intensity after thermal conversion processes, in accordance with one or more embodiments.

FIG. 4 shows Raman plots after thermal conversion processes, in accordance with one or more embodiments, as may further involve process details such as those shown in Table 1 below. Plots 410, 412, 414, 416 and 418 show DNA, Argon, $H_2$, $H_2/CH_4$ (no $Cu^{2+}$), and $H_2/CH_4$ (with $Cu^{2+}$), respectively. Following the standard CVD process above, two distinct peaks are observed in the respective plots at ~1333 $cm^{-1}$ and ~1600 $cm^{-1}$ in the Raman spectrum. These bands are referred to as the D and G peak, respectively; they are two prominent features of $sp^2$ bonded, honeycomb-structured carbon allotropes. The intensity ratios of D to G peak, $I_D/I_G$, measure the degree of disorder in the carbon network. The observed ratio of $I_D/I_G$ for directly grown GNSs is ~0.76, which is lower than the $I_D/I_G$~1-6 measured for arrays of GNSs etched from exfoliated graphene. In pristine graphene the D peak is not present, owing to low defect density. For laterally confined graphene structures, the D band is commonly observed due to the increased contribution of graphene edges, which act as defects and allow elastic inter-valley scattering of electrons. The $I_D/I_G$ ratio increases as the width of the GNSs decreases due to higher contribution of the edge effect.

Various methods herein facilitate the direct growth of GNSs on a dielectric without the need for post-growth transfer or subsequent alignment of the GNSs. The integrity of the dielectric layer and the doped silicon are preserved after subjecting them to high temperature. Various embodiments are directed toward using a silicon nitride dielectric (e.g., 100 nm silicon nitride on a highly doped silicon substrate), to address issues relating to dopant diffusion to the surface and loss of dielectric quality.

Figures 5A, 5B:
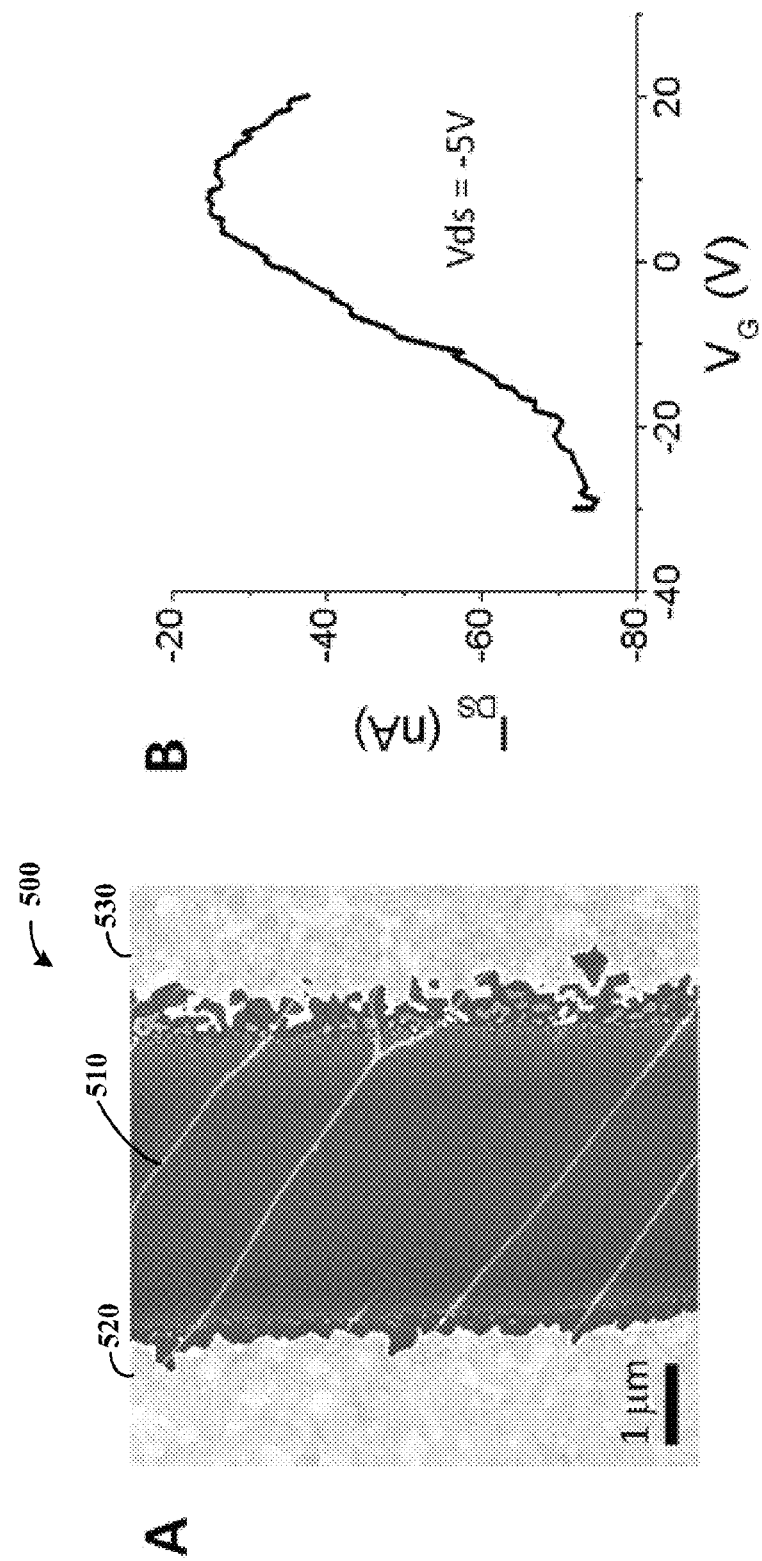
FIG. 5A shows a scanning electron microscope (SEM) image of a field effect transistor, in accordance with another example embodiment.
FIG. 5B shows a plot of drain current ($I_{DS}$) versus gate voltage ($V_G$) of the field effect transistor of FIG. 5A, in accordance with a particular embodiment.

FIG. 5A shows a SEM image of a field effect transistor 500 having GNRs bridging electrodes, in accordance with another example embodiment. By way of example, one of the GNRs 510 is labeled and bridges electrodes 520 and 530. The GNR 510 has material characteristics including dimensions as set via an organic material with coupled metal ions as discussed herein. Such a device may be formed, for example, on an underlying substrate on which the organic material is arranged.

Figures 5C, 5D:
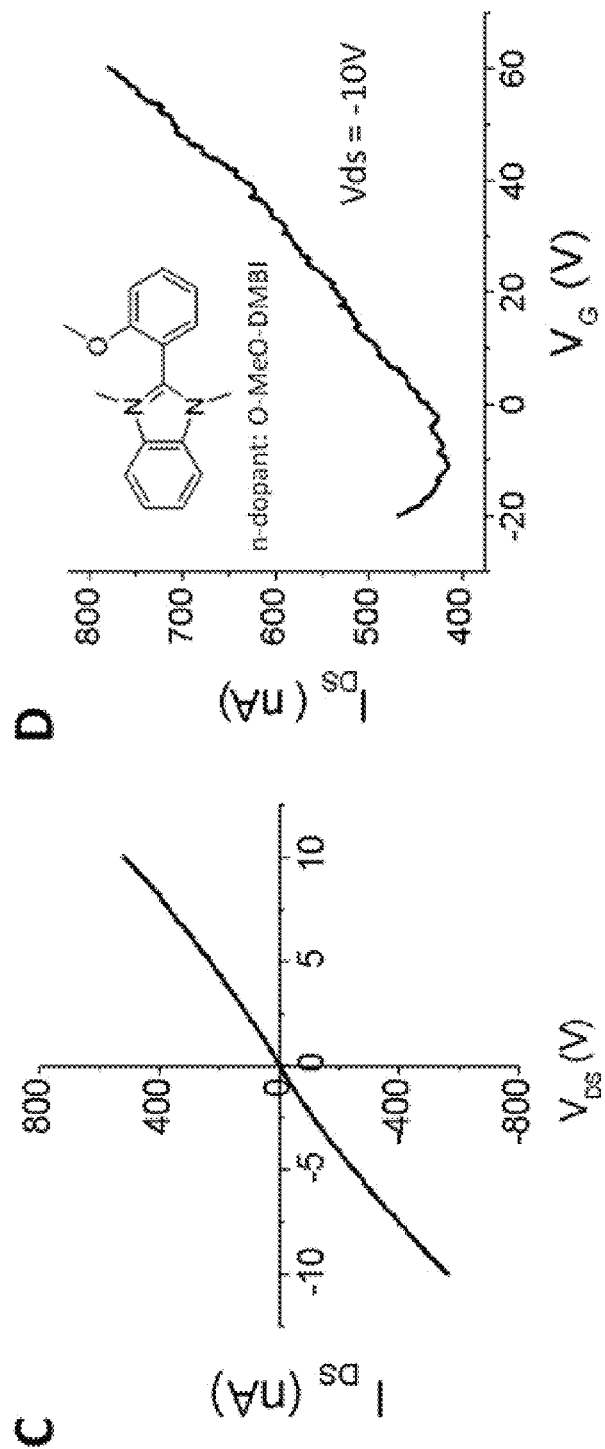
FIG. 5C shows a plot of drain current $I_{DS}$ versus $V_{DS}$ for the field effect transistor of FIG. 5A, in accordance with a particular embodiment.
FIG. 5D shows a plot of drain current ($I_{DS}$) versus gate voltage ($V_G$) the field effect transistor of FIG. 5A, in accordance with a particular embodiment.

FIG. 5B shows a plot of drain current ($I_{DS}$) versus gate voltage ($V_G$) of the field effect transistor 500 at $V_{DS}$=-5V, with the on/off ratio of the device being 3. FIG. 5C shows a plot of drain current $I_{DS}$ versus $V_{DS}$ of the GNRs (including 510), and FIG. 5D shows a plot of drain current ($I_{DS}$) versus gate voltage ($V_G$) of the field effect transistor 500 when n-doped with O-MeO-DMBI-I, at $V_{DS}$=-10V.

Figure 6:
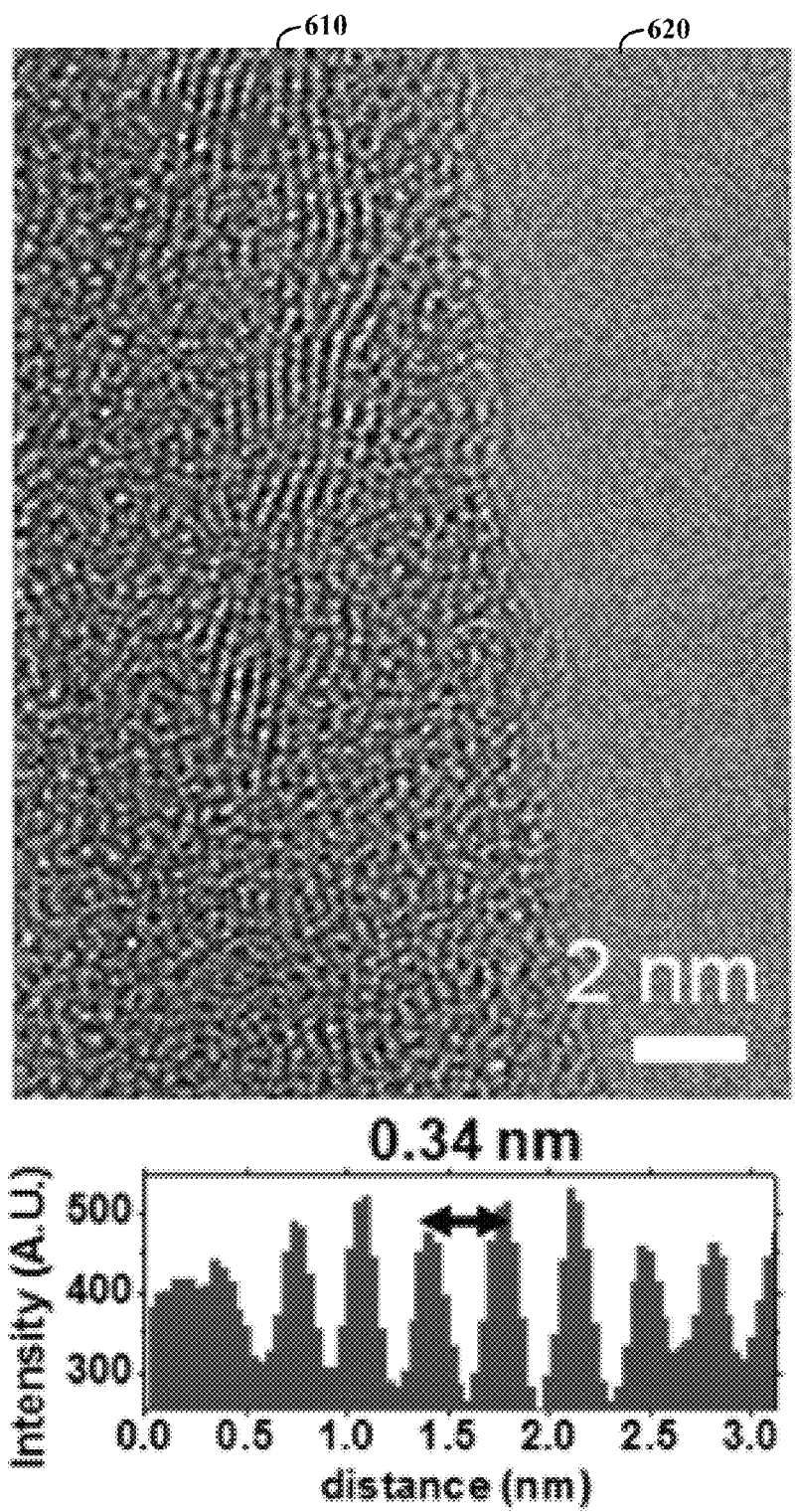
FIG. 6 shows a transmission electron microscopy (TEM) image of graphitic nanoribbons, in accordance with another example embodiment.

FIG. 6 shows a TEM image of GNRs 610 suspended over a $Si_3N_4$ membrane 620, in accordance with another example embodiment. The image is shown at atomic resolution with an underlying plot showing image intensity indicative of lattice spacing. By way of example, arrows are shown indicating 0.34 nm lattice spacing, consistent with interlayer stacking of graphene within the GNR.

Figure 7:
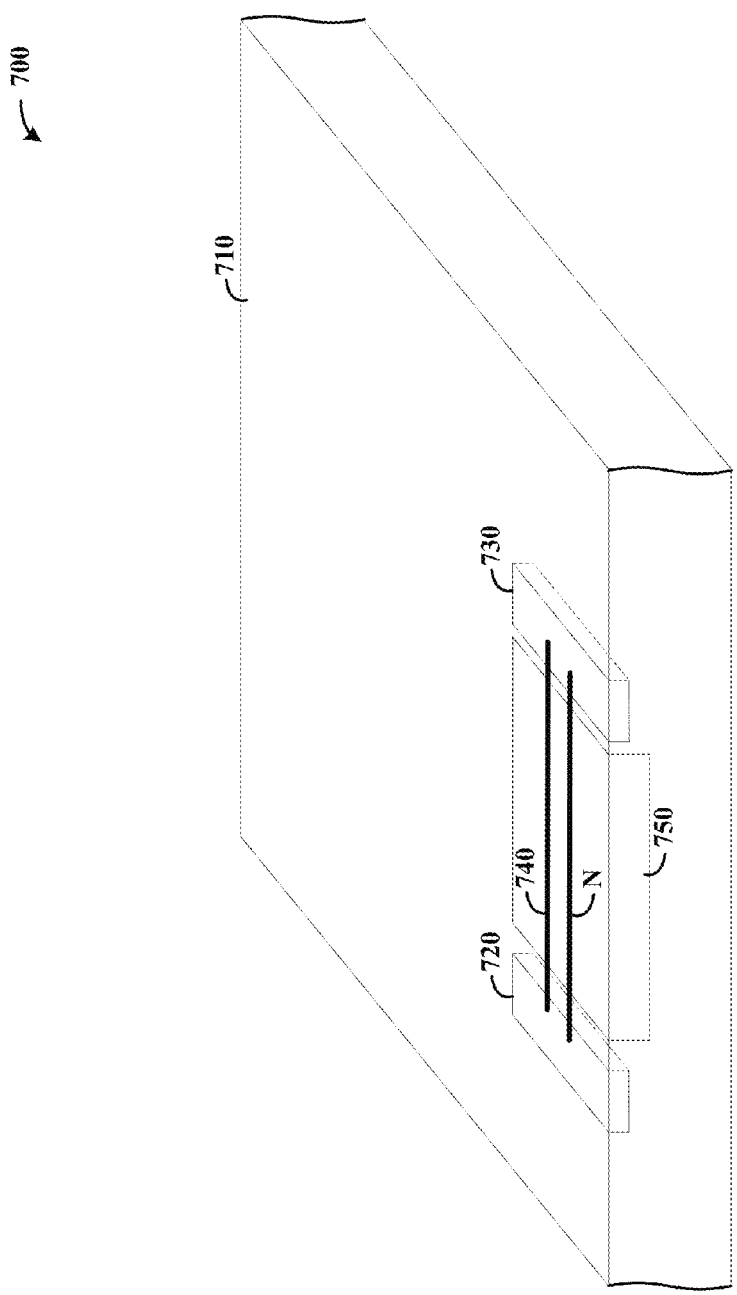
FIG. 7 shows a three-terminal back-gated field effect transistor 700, in accordance with another example embodiment.

FIG. 7 shows a three-terminal back-gated field effect transistor 700, in accordance with another example embodiment. The transistor 700 includes a substrate 710 having conductive source/drain contacts 720 and 730 (e.g., electrodes) separated by a channel portions 740-N, each channel portion including a semiconducting graphitic material having a bandgap as discussed herein. A back gate 750 is located below the channel portions. The source/drain contacts may, for example, be formed with graphene deposited during growth of the graphitic material as discussed herein, or may be implemented with gold deposited by thermal evaporation through a conforming parylene shadow mask. The channel length and width may be set at about 5 μm and 100 μm, respectively. In some implementations, at least about 90% of the channel portions are able to carry current. Various embodiments involve the use of one or more gates, operable to switch one or more channels separating one or more pairs of source and drain electrodes. In some implementations, multiple (e.g., 60 or more) GNRs bridge a single electrode.

The channel portions 740-N may, for example, be formed from and/or include portions of an organic material template extending between the contacts, and which restrict growth of the graphitic material and which impart semiconducting characteristics thereto. This growth may be facilitated using metal ion material that is configured and arranged with the substrate and the organic material to catalyze direct growth of the channels as GNRs, from the organic material, while concurrently growing the graphene source/drain electrodes 720/730.

A number of experimental-type apparatuses, systems and methods are described herein and may be implemented in accordance with one or more embodiments. These support a wide variety of additional embodiments and variations thereof and are not limiting. Consistent with one such embodiment, PTS modification of $SiO_2$ and $Si_3N_4$ wafers is implemented as follows. 300 nm silicon dioxide and 100 nm silicon nitride wafers are exposed to oxygen plasma at 150 W, 250 mTorr for 5 min. The wafers are then immersed in a 0.3% (v/v) phenyltrimethoxysilane and 15% (v/v) triethylamine solution in toluene for 16 h. The wafers are rinsed and sonicated in toluene two times to remove the non-covalently attached molecules.

In other embodiments, stretching and metallization of DNA is carried out as follows. 50 mM of MES buffer is prepared by dissolving 2-(N-morpholino)ethanesulfonic sodium salt in deionized water and adjusting the pH to 5.5 using sodium hydroxide. Lamda DNA is diluted in MES buffer to 30 µg/mL with 30 mM NaCl. The DNA solution is dispensed onto substrates and incubated for 2 min before spin coating at 1 krpm for 30 s. The substrates are then immersed in 0.1M $Cu(NO_3)_2$ for 5 min. As the substrate is quite hydrophobic, the solution de-wets from the substrate and no rinsing is required.

DNA film is formed as follows, in accordance with one or more embodiments. 300 nm silicon dioxide chips are exposed to oxygen plasma. A 500 µg/mL DNA solution is dispensed onto the chip and spin coated at 3000 rpm. The chip is briefly rinsed with DI water to remove the residual buffer salts.

A wafer CVD process is implemented as follows, in accordance with one or more embodiments. Wafers having a polymer-type material as discussed above are placed into a single zone furnace and exposed to CVD growth conditions. The furnace is raised to 1000° C. under a hydrogen flow of 8 sccm at 90 mTorr, and kept at 50 mTorr for 30 min. to reduce copper ions intercalated in DNA. In a growth step, methane and hydrogen are flowed at 8 and 10 sccm respectively at a pressure of 50 mTorr. The temperature is kept at 1000° C. for 30 min. The furnace is then cooled down to room temperature; the hydrogen flow is kept at 8 sccm at 50 mTorr. Table 1 shows various example relative compositions for $sp^2$ and $sp^3$ carbons of GNRs, and starting materials characterized under varying conditions as may be implemented in accordance with various embodiments.

In various embodiments involving electrospun polymer growth, GNRs are achieved through high temperature CVD growth. Such polymers may include certain functional groups that can coordinate with metal ions, such as PVA (polyvinyl alcohol), PAN (polyacrylonitrile), Phenolic resin, and PVP (polyvinyl phenol). The combined metal ions can be further used as catalysts for increasing a percentage of graphitic carbon. Such an approach may be implemented in two steps, to create an electrospun polymer and then effect CVD growth.

In a more detailed/experimental embodiment, an electrospinning solution is made by dissolving various types of polymer with different solvents, for example water, DMF, and THF, with a concentration that is between 5 wt. % to 33 wt. %. Metal salt solids are added into the polymer solutions and stirred for 10-60 min. The metal ions may include, for example, $Cu^{2+}$, $Fe^{2+}$, $Pd^{2+}$, and/or $Co^{2+}$, with concentrations in the range of 1-50 mg/ml. The electrospinning solution is filled into an electrospinning syringe, and 4-20 kV is applied between the syringe needle and collector (a substrate, such as quartz, SiO2/Si wafer, or SiN/Si wafer) to electric-stretch the polymer fibers (e.g., 10 nm-2 um in width). The syringe pump speed is in the range of 0.1-1 ml/min, and the distance between syringe needle and collector is about 10-25 cm. The electrospinning time is within 10 s to 1 hour, leading different fiber densities.

High temperature CVD is then used for graphitizing the electrospun polymer into graphitic nanoribbons. This involves heating, annealing, growth and cooling steps. The heating is carried out under vacuum (5-500 mTorr) in a ramping speed of 5-30 C/min with $H_2$ only or $Ar/H_2$ gas as protection. After reaching 850-1050 C, an annealing step is carried out with protective gas as $H_2$ only or $H_2/CH_4$ for 5-30 min. The temperature is maintained at a certain value (900-1000 C) for GNS growth. A carbon source (such as $H_2/CH_4$) is applied, or no extra carbon source is applied with polymer as carbon source, in different embodiments. After 10-60 min growth, $H_2$ is used to etch away amorphous carbon in the last cooling down step with a ramping speed of 10-50 C/min.

Based upon the above discussion and illustrations, those skilled in the art will readily recognize that various modifications and changes may be made to the various embodiments without strictly following the exemplary embodiments and applications illustrated and described herein. For example, different types of organic materials such as polymers can be implemented with different types of metallic ions to suit one or more embodiments. The embodiments described herein may be implemented together, and respective embodiments

TABLE 1

| Growth Condition | $sp^2$ location eV (FWHM) | $sp^2$ quantity (%) | $sp^3$ location eV (FWHM) | $sp^3$ quantity (%) | C—O, C=O location eV (FWHM) | C—O, C=O quantity (%) |
|---|---|---|---|---|---|---|
| CVD graphene | 284.5 (1.2) | 84.6 | 285.9 (1.75) | 15.4 | — | — |
| SGP | 284.5 (1.2) | 58.2 | 285.4 (1.80) | 27.1 | 288.0 (3.0) | 14.8 |
| $H_2$ | 284.5 (1.2) | 38.4 | 285.1 (1.65) | 41.8 | 287.6 (3.0) | 19.8 |
| Ar | 284.5 (1.2) | 12.9 | 285.1 (1.80) | 71.2 | 288.0 (3.0) | 15.9 |
| DNA Film | 284.5 (1.2) | 2.43 | 285.5 (1.36) | 36.1 | 287.1-290.2 | 59 |
| SGP -No Cu | 284.5 (1.2) | 32.8 | 285.4 (1.75) | 47.0 | 288.1 (3.0) | 20.2 |

Various embodiments involve characterization and analysis using one or more of TEM, scanning electron microscopy (SEM), AFM, Raman Characterization and XPS. In addition, one or more embodiments may be implemented in accordance with, using and/or with applications involving aspects as described in the following references, which are fully incorporated herein by reference.

may be implemented only in part. Embodiments described in connection with graphene, GNSs or GNRs may be implemented with other graphitic material having similar characteristics. In addition, embodiments described in connection with the use of certain organic materials such as DNA may be implemented using one or more polymers, such as those described herein. Further, the embodiments described herein, including those described in the Appendices of the underlying provisional application, may be implemented separately or in combination. In addition, a variety of devices implement aspects of one or more embodiments as described herein, such as a transistor, touch screen, solar cell, radio frequency circuit, photovoltaic circuit, sensor, light emitting diodes, and circuit interconnect. Such modifications do not depart from the true spirit and scope of various aspects of the invention, including aspects set forth in the claims.

What is claimed is:

1. A method comprising the steps of:
providing an organic material template configured and arranged to restrict growth in a width dimension;
growing graphitic material from the organic material template while restricting growth in the width dimension;
providing therefrom grown graphitic material having a set of characteristics, including electrical behavior and shape with a representative width defined by the width dimension, that is based on the configuration and arrangement of the organic material template; and
wherein the organic material template includes at least one of a polymer template and a DNA template.

2. The method of claim 1, wherein the step of growing graphitic material from the organic material template includes:
setting or imparting a bandgap of the grown graphitic material, and
using metal ions to catalyze growth of the graphitic material.

3. The method of claim 1, wherein the organic material template is a solution-processed polymer template.

4. The method of claim 1, wherein the step of growing graphitic material from the organic material template includes:
setting or imparting a bandgap of the grown graphitic material,
introducing a carbon-containing gas and a reductive gas to the organic material template, and
using metal ions for catalyzing growth of the graphitic material from the organic material template, growing the graphitic material using the carbon-containing gas and the reductive gas.

5. The method of claim 4, wherein growing graphitic material includes growing graphitic nanoribbons and wherein the width dimension of the graphitic nanoribbons is not greater than 10 nm.

6. The method of claim 1, wherein the width dimension is not greater than 20 nm.

7. The method of claim 1, wherein the width dimension is not greater than 50 nm.

8. The method of claim 1, wherein the width dimension is not greater than 100 nm.

9. The method of claim 1, wherein
the organic material template is a DNA template, the grown graphitic material includes semiconducting graphitic nanoribbons, the width dimension characterizes the nanoribbons and is not greater than 10 nm, and
the step of growing graphitic material from the organic material template includes setting or imparting a bandgap of the grown graphitic material, and further includes using metal ions to catalyze growth of the graphitic material from the DNA template.

10. The method of claim 1, wherein the step of growing graphitic material from the organic material template while restricting growth in the width dimension includes controlling the width of the graphitic material with the organic material template, therein imparting a bandgap to the graphitic material that renders the graphitic material semiconducting.

11. The method of claim 1, wherein
the step of providing the organic material template includes providing the organic material template on a substrate and configured and arranged to restrict growth of graphitic material in the width dimension, and
the step of growing graphitic material includes concurrently growing semiconducting graphitic nanoribbons from the organic material template and conducting graphene on the substrate.

12. The method of claim 1, wherein the step of growing graphitic material from the organic material template includes using metal ions to catalyze growth of the graphitic material while maintaining binding of the metal ions with organic material under growth conditions in which at least one of Ostwald ripening facilitates diffusion of the metal ions, and metal corresponding to the ions would melt or evaporate.

13. The method of claim 1, wherein the step of growing graphitic material from the organic material template includes at least one of:
doping with an inorganic material;
using doped organic material to dope the graphitic material, and
doping the graphitic material by introducing a carrier gas including a dopant to the organic material while growing the graphitic material.

14. The method of claim 1, wherein the step of growing graphitic material from the organic material template includes at least one of:
catalyzing growth of the graphitic material by reducing metal ions in-situ,
catalyzing $sp^2$ carbon growth using metal ions,
imparting or setting a bandgap in the graphitic material as a function of a density of metal ions on the organic material template, and
using metal ions to screen a negatively-charged component.

15. The method of claim 1, wherein the step of growing graphitic material includes growing semiconducting graphitic nanoribbons from the organic material template, in which the width dimension of the semiconducting graphitic nanoribbons is less than 10 nm, and
further including connecting respective circuit components by growing conducting graphitic nanoribbons having a width dimension that is greater than 10 nm.

16. An apparatus comprising:
graphitic material including a graphitic structure grown from an organic material template;
the graphitic structure including a set of characteristics, including electrical behavior and shape with a representative width defined by a width dimension restricted by the organic material template; and
wherein the organic material template includes at least one of a polymer template and a DNA template.

17. The apparatus of claim 16, wherein the graphitic structure includes metal ions.

18. The apparatus of claim 16, wherein the graphitic structure has a bandgap set or imparted therein by the restricted growth in the width dimension.

19. The apparatus of claim 16, wherein the organic material template is a DNA template and at least a portion or remnants of the organic material template is from the DNA template, and wherein the graphitic structure has a bandgap set or imparted therein by restricted growth in the width dimension provided by the DNA template.

20. The apparatus of claim 16, wherein the graphitic material includes semiconducting graphitic structures in which the width dimension is not greater than 10 nm as a representative width dimension for the semiconducting graphitic structures.

21. The apparatus of claim 16, further including at least remnant portions of the organic material template and a circuit having grown graphitic conductive interconnects, the grown graphitic conductive interconnects having the set of characteristics, including electrical behavior and shape with a representative width defined by a width dimension restricted by the organic material template.

22. An apparatus comprising:
a substrate;
electrode regions on the substrate, the electrode regions including semiconducting graphitic material;
at least remnant portions of an organic material template;
a semiconductor channel including the semiconducting graphitic material extending between the electrode regions and having a set of characteristics, including electrical behavior and shape with a representative width defined by a width dimension that is based on the configuration and arrangement of the organic material template;
metal ions in the substrate or the semiconducting graphitic material, the metal ions being characterized by an ability to catalyze direct growth of graphitic nanoribbons from organic material while concurrently growing the semiconducting graphitic material; and
wherein the organic material template includes at least one of a polymer template and a DNA template.

* * * * *